United States Patent
Grady et al.

(10) Patent No.: US 8,692,549 B2
(45) Date of Patent: Apr. 8, 2014

(54) METHOD FOR RECONSTRUCTING IMAGES OF AN IMAGED SUBJECT FROM A PARALLEL MRI ACQUISITION

(75) Inventors: Leo Grady, Yardley, PA (US); Jonathan R. Polimeni, Cambridge, MA (US)

(73) Assignees: Siemens Aktiengesellschaft, München (DE); The General Hospital Corporation, Boston, MA (US)

( * ) Notice: Subject to any disclaimer, the term of this patent is extended or adjusted under 35 U.S.C. 154(b) by 733 days.

(21) Appl. No.: 12/788,439

(22) Filed: May 27, 2010

(65) Prior Publication Data

US 2010/0308824 A1 Dec. 9, 2010

Related U.S. Application Data

(60) Provisional application No. 61/181,312, filed on May 27, 2009.

(51) Int. Cl.
*G01V 3/00* (2006.01)
*G01R 33/48* (2006.01)

(52) U.S. Cl.
USPC ............ 324/309; 324/307; 324/318; 600/410

(58) Field of Classification Search
USPC .......................... 324/300–322; 600/407–464
See application file for complete search history.

(56) References Cited

U.S. PATENT DOCUMENTS

| 7,279,895 B2 * | 10/2007 | Wang et al. | 324/309 |
| 7,688,068 B2 * | 3/2010 | Beatty | 324/307 |
| 7,942,153 B2 * | 5/2011 | Manstein et al. | 128/898 |
| 8,111,893 B2 * | 2/2012 | Chen et al. | 382/131 |
| 8,335,955 B2 * | 12/2012 | Sinop et al. | 714/746 |

OTHER PUBLICATIONS

Ischer, Seiberlich, Blaimer, Jakob, Breuer and Griswold, "A Combination of Nonconvex Compressed Sensing and GRAPPA (CS-GRAPPA)", Proc. Intl, Soc. Mag. Reson. Med. 17 (2009). p. 2813.*
Liu, SeberL, Zou and Ying, "Sparsesense: Randomly-Sampled Parallel Imaging Using Compressed Sensing", Proc. Intl. Soc. Mag. Reson. Med. 16 (2008). p. 3154.*

* cited by examiner

*Primary Examiner* — Jermele M Hollington
*Assistant Examiner* — Emily Chan
(74) *Attorney, Agent, or Firm* — Donald B. Paschburg

(57) ABSTRACT

A parallel MR imaging method that uses a reconstruction algorithm that combines the GRAPPA image reconstruction method and the compressed sensing (CS) image reconstruction method in an iterative approach (200) or joint energy optimization approach (300).

17 Claims, 3 Drawing Sheets

METHOD FOR RECONSTRUCTING IMAGES OF AN IMAGED SUBJECT FROM A PARALLEL MRI ACQUISITION

CROSS-REFERENCE TO RELATED APPLICATIONS

This application claims the benefit of Provisional U.S. Patent Application Ser. No. 61/181,312 entitled, "System For Reconstructing Images From A Parallel MRI Acquisition Via Combined GRAPPA And Compressed Sensing", filed in the name of Leo Grady and Johnathan R. Polimeni on May 27, 2009, the disclosure of which is also hereby incorporated herein by reference.

FIELD OF INVENTION

The present invention relates to magnetic resonance imaging (MRI). More particularly, the present invention relates to parallel MRI image reconstruction.

BACKGROUND OF THE INVENTION

Magnetic resonance imaging (MRI) is a non-invasive diagnostic imaging procedure that uses nuclear magnetization and radio waves to produce internal images of a patient. The operation of an MRI scanner is well known but, briefly, an MRI scanner contains magnetic coils that create a strong static magnetic field in which the patient is positioned. Certain atoms in a patient's body that were previously randomly-ordered become aligned along the magnetic field. The scanner then sends a series of bursts or pulses of radio frequency (RF) energy through the patient's body part under examination that excite the "ordered" atoms to specific oscillations around the magnetic field. The atoms give up the RF energy, i.e., generate an RF signal, during the pulsed oscillations and as the atoms return to their respective alignments. The scanner detects the RF signals by appropriate reception or pick-up coils and uses gradient coils to generate non-homogeneous magnetic fields to enable the signals to be spatially coded in all three spatial directions. The scanner processes the coded signals or data to transform them into a visual representation of the scanned patient's body part. In particular, the scanner samples and digitizes the signals, creates a so-called k-space data matrix filled with the digitized complex values of each signal, and generates for display and/or other usage a corresponding MR image from the k-space data matrix by means of a complex Fourier transformation. The MRI scanner acquires three-dimensional image data of the patient's body part for respective "slices" of an area of the body part. The scanner repeats a pre-defined MR image pulse sequence, i.e., the above-described steps for collecting the signals/data, a number of times to collect sufficient data from the excitations to reconstruct the specific image. Ideally, there are little or no variations in the nuclear magnetization during the excitations. However, movement by the patient, voluntary or involuntary, is one of several conditions that may affect the nuclear magnetization and the subsequent MR image reconstruction.

MRI is an important imaging technique due to its flexibility and safety. However, there is a fundamental trade-off in MRI between acquisition time and image quality of the reconstructed images. In many circumstances, it is desirable to decrease the acquisition time so as to reduce the image artifacts resulting from the motion of the patient and from breathing or heart beating; to enable dynamic imaging; and to reduce overall examination times. Many techniques and technologies have been developed to improve image acquisition time.

Parallel imaging is a relatively new technique/technology that is designed to reduce the image acquisition time and has enabled many powerful improvements in routine clinical MRI; in particular, it enables dramatic acceleration of the MRI examination. Generally, an MRI scanner employing parallel imaging accomplishes this by obtaining spatial information from arrays of multiple independent radiofrequency (RF) coil detectors sampling data in parallel rather than from some portion of the spatial encoding which is performed using the gradient coils (typically the phase-encoding gradient). Only a fraction of the phase-encoding lines of image data is then acquired (i.e., under sampling k-space data) since phase encoding consumes much more time compared to the other location encodings. The MRI scanner applies a specialized reconstruction method to the acquired data to reconstruct the missing information, resulting in the full field-of-view (FOV) image in a fraction of the time. Many of the time-consuming image encoding steps can be skipped during the acquisition and then subsequently recovered in post-processing by exploiting the independent observations collected from each RF reception coil. This technique results in a significant decrease in the acquisition time, allowing for shorter examinations or for higher temporal sampling rates in dynamic imaging.

There are several parallel imaging reconstruction methods. One of the leading approaches for image reconstruction in parallel MRI is the GRAPPA method (this is more fully described in an article by M. A. Griswold, P. M. Jakob, R. M. Heidemann, N. Nittka, V. Jellus, J. M. Wang, B. Kiefer, and A. Haase, "Generalized autocalibrating partially parallel acquisitions (GRAPPA)", Magnetic Resonance in Medicine, 47:1202-1210, 2002). GRAPPA enables image reconstruction for accelerated acquisitions by estimating skipped k-space data through weighted combinations of raw k-space measurements across all channels in the RF receive coil array. Thereafter, the k-space data undergoes Fourier transformation. In contrast, compressed sensing (CS) image reconstruction techniques typically enable image reconstruction of accelerated acquisitions by examining and exploiting sparsity measures phrased in image space. Compressed sensing (CS) reconstructs images from each RF reception coil element with reduced FOV and then merges the images using knowledge of individual coil sensitivities.

It would be advantageous to jointly optimize both CS and GRAPPA error measures to produce reconstructed images that are consistent in both k-space and image space.

SUMMARY OF THE INVENTION

The above problems are obviated by the present invention which provides a method for reconstructing images of an imaged subject from a parallel MRI acquisition, comprising generating, for a each response signal received by a respective RF reception coil, a complete dataset in k-space from a reduced k-space dataset of the respective response signal and associated weighting factors for the reduced k-space dataset; spatially transforming the each complete k-space dataset generated to obtain an estimated reconstructed image for a respective RF reception coil, the estimated reconstructed image having a measure of sparsity; maximizing the sparsity of the estimated reconstructed images; repeating the generating and the spatially transforming steps using revised associated weighting factors obtained from each respective k-space dataset that results from the maximizing step; and combining the estimated reconstructed images for the respective RF reception coils to obtain a reconstructed image of the imaged subject. The generating step and the spatially transforming step may each be performed using a generalized autocalibrating partially parallel acquisitions technique. In such case, or separately, the maximizing step may comprise maximizing using a compressed sensing technique. Also separately, the generating step may comprise deriving the associated weighting factors from reference calibration data for a respective reduced k-space dataset. Alternatively, the generating step may comprise deriving the associated weighting factors from reference calibration data that is obtained from a respective reduced k-space dataset. The generating step may comprise deriving the associated weighting factors from reference calibration data that is obtained from a respective reduced k-space dataset and the repeating step may comprise deriving the revised associated weighting factors from reference calibration data that is obtained from a respective complete k-space dataset that results from the maximizing step. Further, the maximizing step may comprise optimizing a sparsifying transform of an estimated reconstructed image over the set of values of the unacquired k-space data missing in the respective reduced k-space dataset. In such case, the generating step may comprise deriving the associated weighting factors from reference calibration data that is obtained from a respective reduced k-space dataset and the repeating step may comprise deriving the revised associated weighting factors from reference calibration data that is obtained from a respective complete k-space dataset that results from the maximizing step. Also, the maximizing step may comprise maximizing using a compressed sensing technique and may further comprise optimizing a sparsifying transform of an estimated reconstructed image over the set of values of the unacquired k-space data missing in the respective reduced k-space dataset. Also, the combining step may comprise combining the estimated reconstructed images using a sum of squares reconstruction to obtain a reconstructed image of the imaged subject.

The present invention may also provide a method for obtaining an image of a subject by a parallel MR imaging device, comprising a) generating image reconstruction data from a generalized autocalibrating partially parallel acquisitions reconstruction of weighted under-sampled k-space data acquired by each RF reception coil of the device; b) calculating new weightings for respective under-sampled k-space data from k-space data obtained from a compressed sensing reconstruction of the image reconstruction data previously generated; and c) reconstructing the subject image according to the image reconstruction data generated from repeating the generating and calculating steps until convergence is achieved. In such case, the generating step may comprise deriving the weightings from calibration data that is obtained from respective under-sampled k-space data. Also, the compressed sensing reconstruction may obtain k-space data by maximizing sparsity measures of a reconstructed image from the image reconstruction data generated. Alternatively, the compressed sensing reconstruction may obtain k-space data by optimizing a sparsifying transform of a reconstructed image over the set of values of the unacquired k-space data missing in the respective under-sampled k-space data. Also, the reconstructing step may comprise reconstructing using a weighted combination of the individual image reconstructions from each RF reception coil of the device.

The present invention may also provide a method for obtaining an image of a subject using parallel MR imaging, comprising a) generating image reconstruction data from a generalized autocalibrating partially parallel acquisitions (GRAPPA) reconstruction of weighted under-sampled k-space data acquired by each RF reception coil; b) generating image reconstruction data from a compressed sensing (CS) reconstruction of under-sampled k-space data acquired by each RF reception coil; c) reconstructing the subject image according to the image reconstruction data generated and the formula $$\min_{x} \|\Psi x\|_0 + \lambda \|\Psi x - CDW\bar{y}\|_2,$$

where x represents the pixel intensities of the reconstructed images for the RF reception coils; $\Psi$ represents a sparsifying transform; C represents a weighting matrix from the RF reception coils or the image estimates; D represents a block-diagonal matrix consisting of a discrete Fourier transform matrix; W represents a matrix operator that stores sets of weights which vary with the RF reception coils that may be applied to produce missing data in under-sampled k-space data; $\bar{y}$ represents the concatenated vector of the under-sampled k-space data from all the RF reception coils; and $\lambda$ represents a parameter to control the degree to which the formula solution indicates a GRAPPA or a CS solution.

The present invention may also provide a parallel magnetic resonance imaging apparatus comprising means for obtaining magnetic resonance image data of an imaged subject using a plurality of RF reception coils; means for generating in parallel a plurality of weighted reduced k-space datasets, which contain a fraction of the image data, from the magnetic resonance image data; and means for performing a generalized autocalibrating partially parallel acquisitions (GRAPPA) reconstruction of the weighted reduced k-space datasets acquired by the RF reception coils and combining the GRAPPA image reconstruction with a compressed sensing (CS) image reconstruction in an iterative approach or joint energy optimization approach to reconstruct the imaged subject according to the image reconstruction data.

DESCRIPTION OF THE DRAWINGS

For a better understanding of the present invention, reference is made to the following description of an exemplary embodiment thereof, and to the accompanying drawings, wherein.

DETAILED DESCRIPTION

Figure 1:
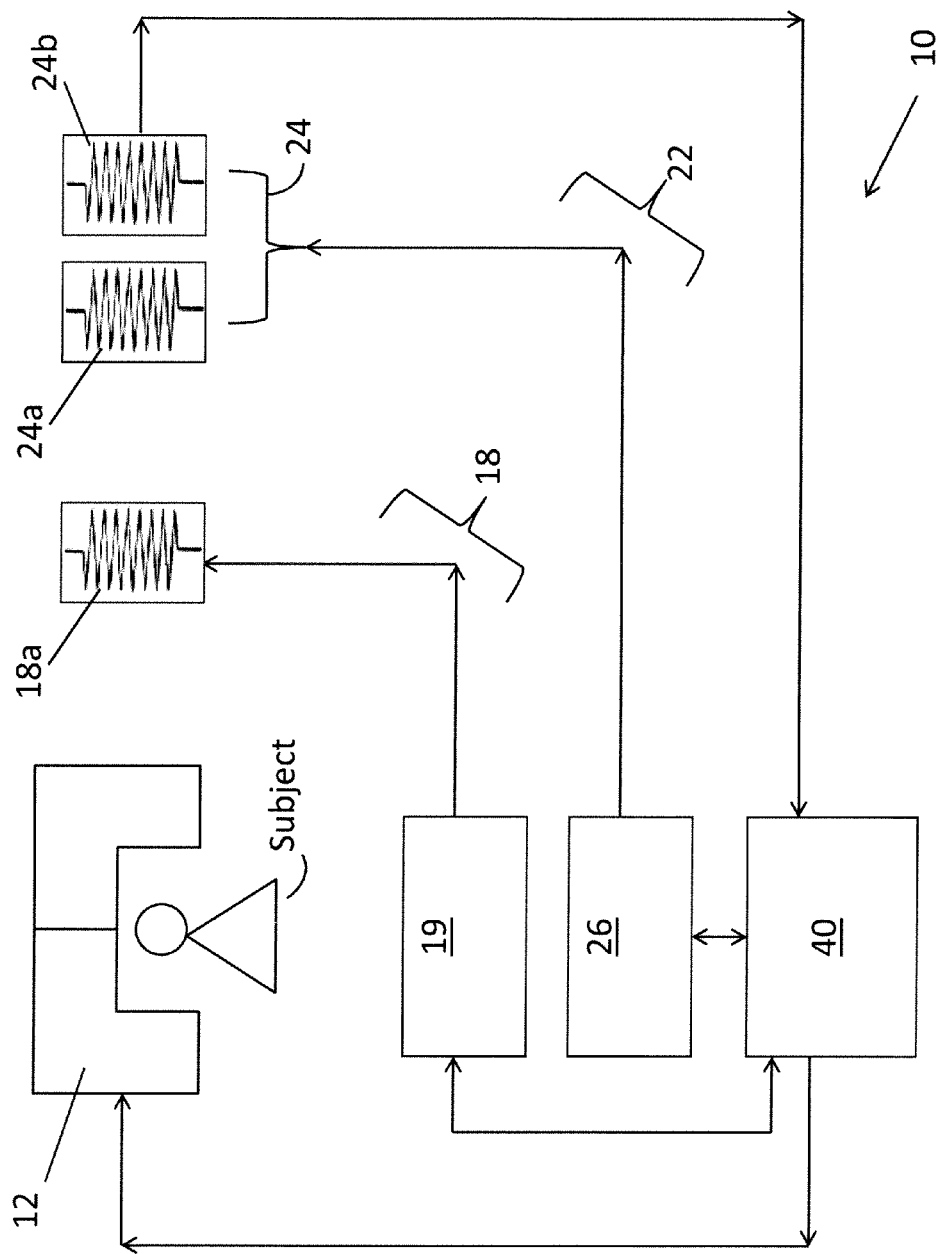
FIG. 1 is a block diagram of an MR scanner operable in accordance with the present invention.

FIG. 1 is a block diagram of a conventional MRI scanner 10 (simplified) that performs parallel MR image reconstruction in accordance with the present invention. A main magnet 12 generates a strong static magnetic field in an imaging region where the subject (i.e., patient or the specific body part of a patient to be examined) is introduced. The magnet 12 is used to polarize the patient's body part, i.e., certain atoms in the patient's body part that were previously randomly-ordered become aligned along the magnetic field. A gradient coil system 18, having a gradient coil subsystem 18*a* and a gradient coil control unit 19, generates a time-varying linear magnetic field gradient in respective spatial directions, x, y and z, and spatially encodes the positions of the polarized or excited atoms. An RF system 22, having an RF coil subsystem 24 and a pulse generation unit 26, transmits a series of RF pulses to the patient's body part to excite the "ordered" atoms of the patient's body part. The RF coil subsystem 24 may be adapted to switch between a transmission mode and reception mode and may comprise a RF transmission coil 24a and an RF reception coil arrangement/array 24b (which may have a plurality of reception coils and/or reception coil channels) that is capable of acquiring multiple channels of data in parallel.

A control or computer system 40 coordinates the pulse generation unit 26, the gradient coil control unit 19, and other components to carry out a desired MR image pulse sequence. The scanner 10 repeats the MR image pulse sequence a number of times so the atoms oscillate around the polarized alignment direction (along the main magnetic field) during the excited state caused by the energy of RF pulses. The atoms release the RF energy, i.e., generate an RF signal, during the resonance or oscillation and as the atoms return to their respective alignments. The RF coil system 24 detects the released RF energy, via the RF reception coil arrangement/array 24a, and generates spatially-coded MR signals to the computer system 40.

Figure 2:
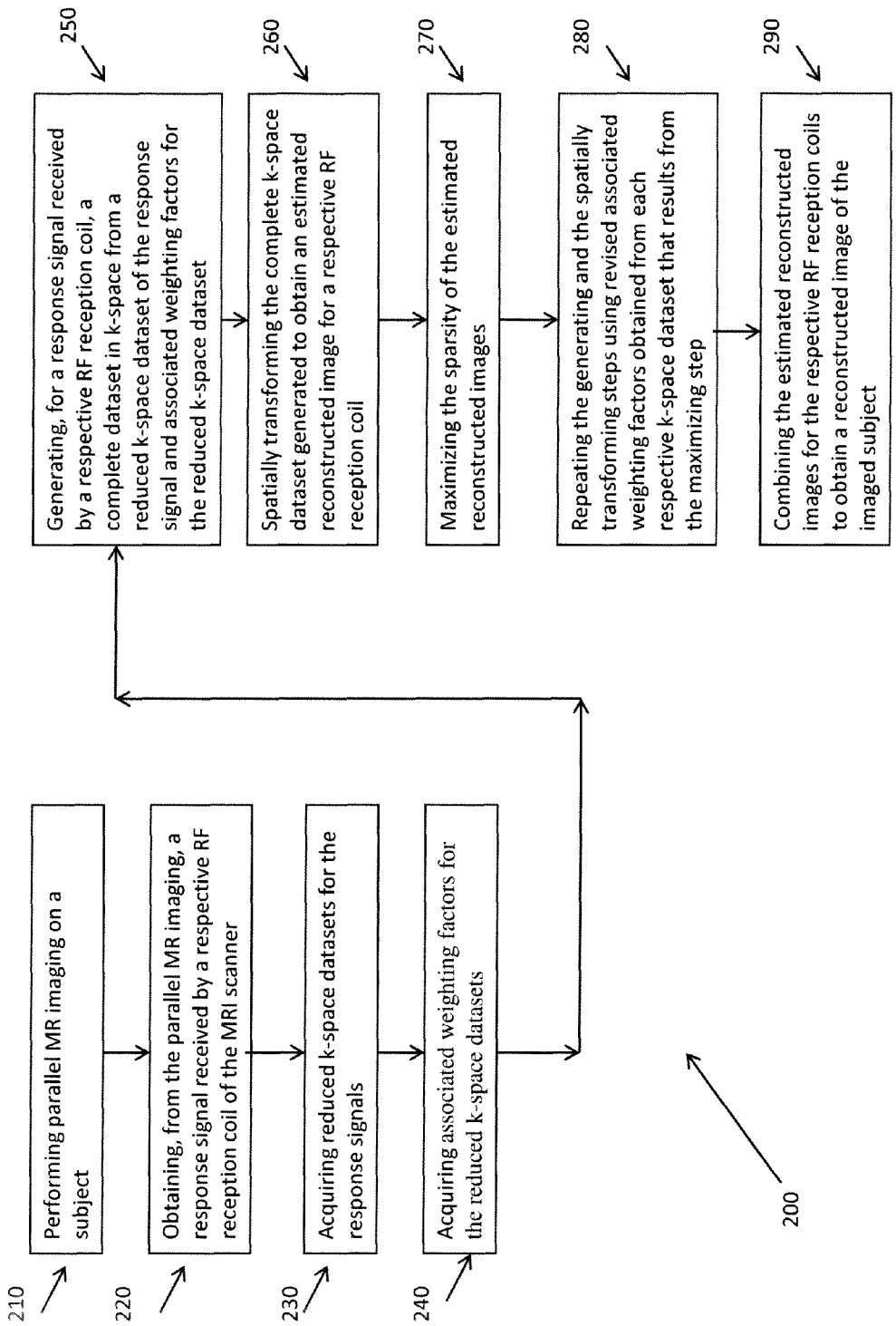
FIG. 2 is a flow chart of a first method of operation by the MR scanner of FIG. 1 in accordance with the present invention.
Figure 3:
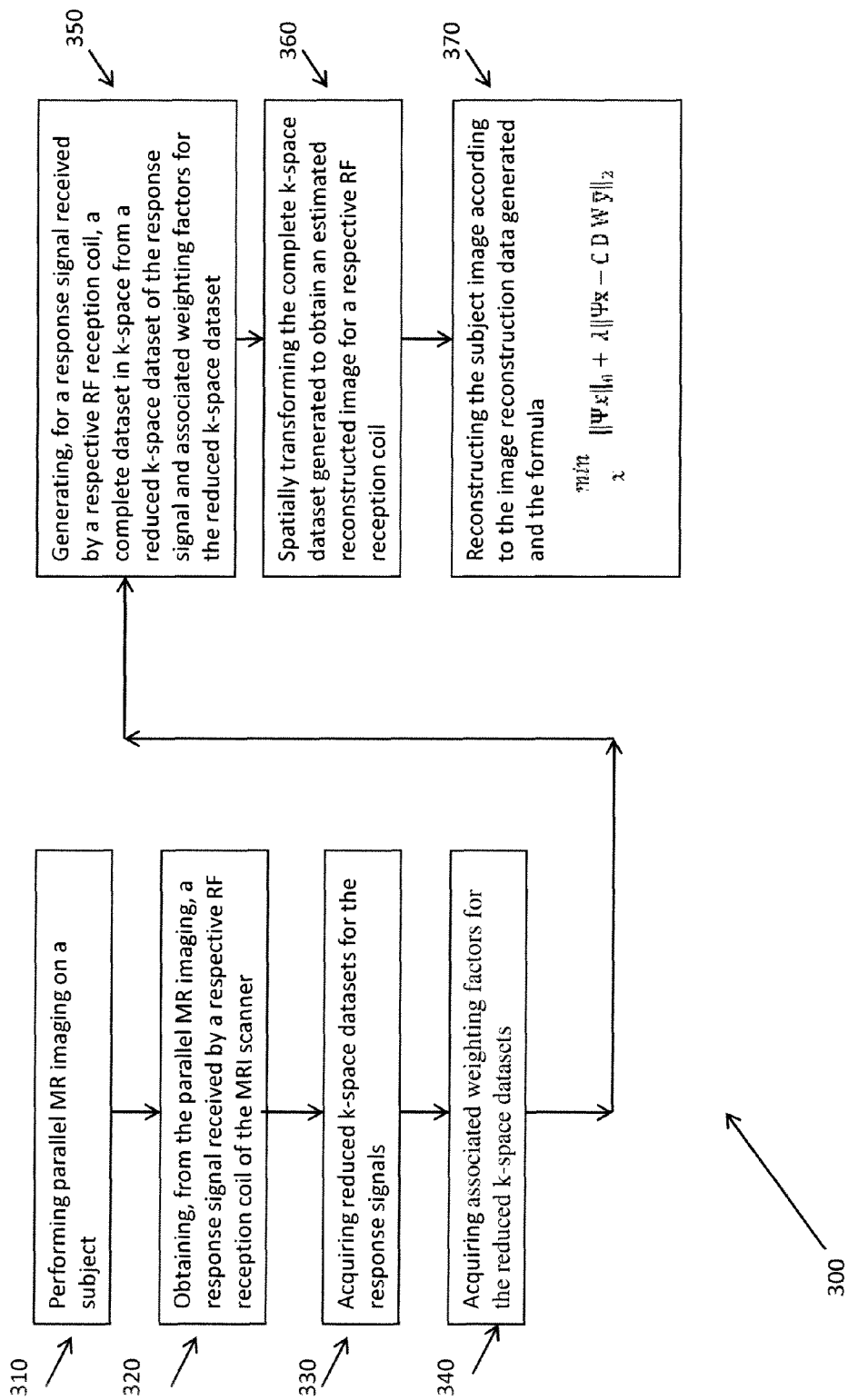
FIG. 3 is a flow chart of a second method of operation by the MR scanner of FIG. 1 in accordance with the present invention.

The computer system 40, which controls the operation of the MR scanner 10 and its components, processes the MR signals to transform them into a visual representation of the patient's body part (i.e., reconstructed MR images). In particular, the computer system 40 digitizes the signals, constructs a k-space data matrix filled with the digitized complex values of each signal, and generates for display, storage, and/or other usage a corresponding MR image from the k-space data matrix using well-known mathematical techniques, such as a complex Fourier transformation. Movements by the patient in the imaging region are likely to affect the nuclear magnetization and image reconstruction. To reduce the acquisition time of the reconstructed images (and thus increase the image quality), among other purposes, the MR scanner 10 is adapted to operate according to methods of the present invention as shown in FIGS. 2 and 3.

As noted above, the GRAPPA algorithm is a well-known auto-calibrated reconstruction method that estimates missing k-space data for a given RF reception coil from weighted linear combinations of acquired data across all coils in the RF reception coil array. The weights are derived from fully-sampled reference data referred to as "Auto-Calibration Signals" or ACS data. To better understand the following summarized description of the GRAPPA approach, certain notation for describing the image reconstruction is first discussed. Let x represent the pixel intensities of the reconstructed image. Let $\bar{y}_i$ represent the acquired data from an RF reception/target coil i and let n represent the number of coil channels. Let F represent the discrete inverse Fourier transform matrix, and let the concatenation $y_i = |\bar{y}_i; \hat{y}_i|$ represent the full k-space data at an RF reception/target coil i (i.e., the acquired data in $\bar{y}_i$ and the missing data in $\hat{y}_i$).

Briefly, the GRAPPA approach for reconstructing an image begins by generating a set of weights stored in a matrix operator $W_{i,j}$, which varies with an RF source coil j and an RF target coil i, that may be applied to produce the missing data in k-space. Specifically, given an operator $W_{i,j}$, a complete set of k-space information for an RF reception/target coil i may be produced as $$y_i = \sum_{j=1}^{n} W_{i,j} \bar{y}_j. \tag{1}$$

Given the full k-space data $y_i$, for each RF target coil i, an estimate of the reconstructed image $p_i$ for an RF target coil i may be produced via $$p_i = F y_i = F W_{i,j} \bar{y}_j. \tag{2}$$

The final image is then formed from a weighted linear combination of the individual image reconstructions, $$x = \sum_{i=1}^{n} C_i p_i. \tag{3}$$

The weighting matrix $C_i$ is diagonal and the weighting coefficients could be generated with any method. Common approaches to finding a weighting matrix are to derive the diagonal elements of the weighting matrix $C_i$ from the coil sensitivity profiles, or from the image estimates themselves as in the standard root-sum-of-squares combination method.

The notation is adopted herein that any coil-associated variable without a subscript indicates a concatenated vector of all coils in the RF coil array, e.g., $y = |y_1; y_2; \ldots; y_n|$, $C = |C_1; C_2; \ldots; C_n|$ or $$W = \begin{bmatrix} W_{1,1} & \cdots & W_{1,n} \\ \vdots & \ddots & \vdots \\ W_{n,1} & \cdots & W_{n,n} \end{bmatrix}. \tag{4}$$

Equation 3 indicated above may therefore be rewritten in matrix form as $$x = Cp. \tag{5}$$

Consequently, the entire reconstruction process using the GRAPPA method can be rewritten in matrix form as $$x = Cp = CDy = CDW\bar{y} \tag{6},$$

where D is a block-diagonal matrix consisting of the DFT matrix F on each block defined as $$D = \begin{bmatrix} F & 0 & \cdots & 0 \\ 0 & F & \cdots & 0 \\ \vdots & & \ddots & \vdots \\ 0 & 0 & \cdots & F \end{bmatrix}. \tag{7}$$

Also, as noted above, compressed sensing (CS) is a well-known approach to image reconstruction that attempts to maximize the sparseness (i.e., the number of zero values) of a sparsifying operator acting on the reconstructed image. A summarized description only is provided herein. Specifically, given data acquisition constraints, a compressed sensing (CS) approach to image reconstruction constrained on an accelerated or under-sampled k-space acquisition would be formulated as the solution to the optimization problem, $$\min \|\psi x\|_0$$

$$\text{s.t. } F_A^T p_i = \bar{y}_i, \forall i \tag{8},$$

where ψ represents some sparsifying transform such as the image gradient or wavelet basis (more fully described in an article by M. Lustig, D. L. Donoho, and J. M. Pauly, "Sparse MRI: The application of compressed sensing for rapid MR imaging", *Magnetic Resonance in Medicine,* 58 (6): 1182-1195, December 2007), $F_A$ represents the portion of the inverse DFT matrix corresponding to the acquired set of k-space data A, and $F_A^T$ represents the corresponding forward DFT matrix. Since Equation 8 is NP-Hard, practical optimization of Equation 8 may be performed via approximation of the norm $\|\cdot\|_0$ by $\|\cdot\|_1$ (more fully described in the Lustig, et al. article above) or by an iterative re-weighted approximation of $\|\cdot\|_0$ (more fully described in an article by J. Trzaska, A. Manduca, and E. Borisch, "Robust kernel methods for sparse MR image reconstruction", In N. Ayache, S. Ourselin, and A. Maeder, editors, *Proc. Of MICCAI* 2007, volume Part 1 of LNCS, pages 809-816. Springer-Verlag, 2007). The term NP-Hard is well understood from the computational complexity field as an abbreviation for the term "non-deterministic polynomial-time hard" which signifies a class of problems that are at least as hard as the hardest problems in the NP set of decision problems. Also, Equation 8 is a nonconvex optimization, thus the initial solution for x will have an impact on the final solution obtained via any descent procedure.

The constrained optimization in Equation 8 may be replaced by an unconstrained optimization in the nullspace of the constraints. Specifically, since the nullspace variables correspond to the unacquired k-space data $\hat{y}$ for each RF target coil, Equation 8 may be rewritten as an unconstrained optimization over such data $\hat{y}$ in the form:

$$\min_{\hat{y}} \|\Psi C(D_A \bar{y} + D_{\bar{A}} \hat{y})\|_0 \tag{9}$$

where $\bar{A}$ indicates the set complement of A and $D_A$ is used to indicate the block diagonal matrix consisting of blocks of $F_A$.

The nullspace approach to compressed sensing (CS) presented above is directly compatible with the GRAPPA formalism in that both approaches estimate missing k-space data to remove aliasing in the image domain due to undersampling under the constraint that the original, acquired k-space data is not altered in the process. The present invention exploits this commonality and provides methods to combine the two approaches to reconstruct MR images.

FIG. 2 shows one method of operation 200 of the MRI scanner 10 in accordance with the present invention. Briefly, the MRI scanner 10 performs parallel MR imaging on a subject (step 210) and obtains response signals from the RF reception coils in the RF reception coil arrangement/array 24a in parallel (step 220). The MRI scanner 10 processes the response signals to obtain k-space datasets for the RF reception coils. However, the MRI scanner 10 only samples/collects or acquires a fraction of the raw image data (usually a fraction of the phase-encoding lines of the k-space datasets), i.e., it acquires reduced or under-sampled k-space datasets (step 230).

The MRI scanner 10 then applies a reconstruction method according to the present invention to the parallel MRI acquisition data to reconstruct the missing information and the images of the imaged subject. In particular, the MRI scanner 10 uses a reconstruction algorithm that combines the GRAPPA method and the compressed sensing (CS) method in an iterative approach that alternates the solutions of Equations 9 and 2. Specifically, the algorithm undertakes the following steps. First, the algorithm performs a GRAPPA reconstruction to estimate a complete set of k-space information $y_i$ for each RF reception/target coil i (step 250). More specifically, the algorithm uses ACS training data to calculate matrices $W_{i,j}$ across all RF source coils j (step 240) and solves Equation 2 to obtain an initial solution $\hat{y}_i$ for an RF target coil i, following the standard GRAPPA procedure (step 260).

The algorithm performs the next steps until convergence is achieved. Given the current set of estimated k-space data $y_i$ for an RF target coil i, the algorithm maximizes sparsity in the reconstructed image x by optimizing Equation 9 for $\hat{y}$ (step 270). Next, using the solution obtained from optimizing Equation 9, the algorithm calculates new weight matrices $W_{i,j}$ with the standard GRAPPA fitting approach, except that the $W_{i,j}$ values are computed using the full set of estimated k-space data obtained from the compressed sensing (CS) optimization of Equation 9 rather than the initial set of ACS lines (step 280). The MRI scanner 10 combines the estimated reconstructed images for the respective RF reception coils to obtain a reconstructed image of the imaged subject (step 290).

FIG. 3 shows another method 300 of operation of the MRI scanner 10 in accordance with the present invention. Similarly described above, the MRI scanner 10 performs parallel MR imaging on a subject (step 310) and obtains response signals from the RF reception coils in the RF reception coil arrangement/array 24a in parallel (step 320). The MRI scanner 10 processes the response signals to obtain k-space datasets for the RF reception coils. However, the MRI scanner 10 only samples/collects or acquires a fraction of the raw image data (usually a fraction of the phase-encoding lines of the k-space datasets), i.e., it acquires reduced or under-sampled k-space datasets (step 330).

The MRI scanner 10 then applies a reconstruction method according to the present invention to the parallel MRI acquisition data to reconstruct the missing information and the images of the imaged subject. In particular, the MRI scanner 10 uses a reconstruction algorithm that combines the GRAPPA method and the compressed sensing (CS) method to produce a joint optimization of the GRAPPA energy and the compressed sensing (CS) energy. Similar to the iterative approach, the algorithm performs a GRAPPA image reconstruction to estimate a complete set of k-space information $y_i$ for each RF reception/target coil i (step 350). The algorithm uses ACS data to calculate matrices $W_{i,j}$ across all RF source coils j (step 340) and solves Equation 2 to obtain an initial solution $\hat{y}_i$ for an RF target coil i, following the standard GRAPPA procedure (step 360).

Specifically, the image reconstruction using the joint optimization approach then is a solution to the problem $$\min_{x} \|\Psi x\|_0 + \lambda \|\Psi x - CDW\bar{y}\|_2 \tag{10}$$

This can be alternately written in terms of the variables $\hat{y}$ as the following:

$$\min_{\hat{y}} \|\Psi C(D_A \bar{y} + D_{\bar{A}} \hat{y})\|_0 + \lambda \|C(D_A \bar{y} + D_{\bar{A}} \hat{y}) - CDW\bar{y}\|_2 \tag{11}$$

Finding a minimum to Equation 11 is NP-Hard, but an efficient optimization of Equation 11 may be found by approximating the $\|\psi x\|_0$ term to either $\|\psi x\|_1$ or the successive robust functions (i.e., $\|\psi x\|_0 \approx \sigma(\psi x)$) as suggested in the Trzaska, et al. article above. The parameter λ may be used to control the degree to which the solution resembles the GRAPPA reconstruction (i.e., high λ value) or the compressed sensing (CS) solution (i.e., low λ value).

Other modifications are possible within the scope of the invention. For example, the subject to be scanned may be an animal subject or any other suitable object rather than a human patient. Also, the MR scanner 10 has been described in a simplified fashion and may be constructed in various well-known manners and using various well-known components. For example, the computer system 40 may incorporate the control portions of the various scanner 10 components or may be modularly constructed with separate but coordinated units, such as an image processing unit, user interfaces, MR image pulse sequence control unit, etc. Also, although the steps of each method have been described in a specific sequence, the order of the steps may be re-ordered in part or in whole.

What is claimed is:

1. A method for reconstructing images of an imaged subject from a parallel MRI acquisition, comprising:
   a. generating, for each response signal received by a respective RF reception coil, a complete dataset in k-space from a reduced k-space dataset of the respective response signal and associated weighting factors for the reduced k-space dataset;
   b. spatially transforming each complete k-space dataset generated to obtain an estimated reconstructed image for a respective RF reception coil, the estimated reconstructed image having a measure of sparsity;
   c. maximizing the sparsity of the estimated reconstructed images;
   d. repeating the generating and the spatially transforming steps using revised associated weighting factors obtained from each respective k-space dataset that results from the maximizing step; and
   e. combining the estimated reconstructed images for the respective RF reception coils to obtain a reconstructed image of the imaged subject.

2. The method of claim 1, wherein the generating step and the spatially transforming step are each performed using a generalized autocalibrating partially parallel acquisitions technique.

3. The method of claim 2, wherein the maximizing step comprises maximizing using a compressed sensing technique.

4. The method of claim 1, wherein the generating step comprises deriving the associated weighting factors from reference calibration data for a respective reduced k-space dataset.

5. The method of claim 1, wherein the generating step comprises deriving the associated weighting factors from reference calibration data that is obtained from a respective reduced k-space dataset.

6. The method of claim 1, wherein the generating step comprises deriving the associated weighting factors from reference calibration data that is obtained from a respective reduced k-space dataset and the repeating step comprises deriving the revised associated weighting factors from reference calibration data that is obtained from a respective complete k-space dataset that results from the maximizing step.

7. The method of claim 1, wherein the maximizing step comprises maximizing using a compressed sensing technique.

8. The method of claim 7, wherein the maximizing step comprises optimizing a sparsifying transform of an estimated reconstructed image over the set of values of the unacquired k-space data missing in the respective reduced k-space dataset.

9. The method of claim 1, wherein the maximizing step comprises optimizing a sparsifying transform of an estimated reconstructed image over the set of values of the unacquired k-space data missing in the respective reduced k-space dataset.

10. The method of claim 9, wherein the generating step comprises deriving the associated weighting factors from reference calibration data that is obtained from a respective reduced k-space dataset and the repeating step comprises deriving the revised associated weighting factors from reference calibration data that is obtained from a respective complete k-space dataset that results from the maximizing step.

11. The method of claim 1, wherein the combining step comprises combining the estimated reconstructed images using a sum of squares reconstruction to obtain a reconstructed image of the imaged subject.

12. A method for obtaining an image of a subject by a parallel MR imaging device, comprising a) generating image reconstruction data from a generalized autocalibrating partially parallel acquisitions reconstruction of weighted under-sampled k-space data acquired by each RF reception coil of the device; b) calculating new weightings for respective under-sampled k-space data from k-space data obtained from a compressed sensing reconstruction of the image reconstruction data previously generated; and c) reconstructing the subject image according to the image reconstruction data generated from repeating the generating and calculating steps until convergence is achieved.

13. The method of claim 12, wherein the generating step comprises deriving the weightings from calibration data that is obtained from respective under-sampled k-space data.

14. The method of claim 12, wherein the compressed sensing reconstruction obtains k-space data by maximizing sparsity measures of a reconstructed image from the image reconstruction data generated.

15. The method of claim 12, wherein the compressed sensing reconstruction obtains k-space data by optimizing a sparsifying transform of a reconstructed image over the set of values of the unacquired k-space data missing in the respective under-sampled k-space data.

16. The method of claim 12, wherein the reconstructing step comprises reconstructing using a weighted combination of the individual image reconstructions from each RF reception coil of the device.

17. A method for obtaining an image of a subject using parallel MR imaging, comprising a) generating image reconstruction data from a generalized autocalibrating partially parallel acquisitions (GRAPPA) reconstruction of weighted under-sampled k-space data acquired by each RF reception coil; b) generating image reconstruction data from a compressed sensing (CS) reconstruction of under-sampled k-space data acquired by each RF reception coil; c) reconstructing the subject image according to the image reconstruction data generated and the formula $$\min_{x} \|\Psi x\|_0 + \lambda \|\Psi x - CDW\bar{y}\|_2,$$

where x represents the pixel intensities of the reconstructed images for the RF reception coils; Ψ represents a sparsifying transform; C represents a weighting matrix from the RF reception coils or the image estimates; D represents a block-diagonal matrix consisting of a discrete Fourier transform matrix; W represents a matrix operator that stores sets of weights which vary with the RF reception coils that may be applied to produce missing data in under-sampled k-space data; $\bar{y}$ represents the concatenated vector of the under-sampled k-space data from all the RF reception coils; and $\lambda$ represents a parameter to control the degree to which the formula solution indicates a GRAPPA or a CS solution.

\* \* \* \* \*